(12) United States Patent
Suzuki

(10) Patent No.: US 8,954,123 B2
(45) Date of Patent: Feb. 10, 2015

(54) CONNECTOR COVER AND MOBILE TYPE ELECTRONIC DEVICE

(75) Inventor: Kensaku Suzuki, Tokyo (JP)

(73) Assignee: Lenovo Innovations Limited (Hong Kong), Quarry Bay (HK)

( * ) Notice: Subject to any disclaimer, the term of this patent is extended or adjusted under 35 U.S.C. 154(b) by 602 days.

(21) Appl. No.: 12/738,011

(22) PCT Filed: Nov. 12, 2008

(86) PCT No.: PCT/JP2008/070620
§ 371 (c)(1),
(2), (4) Date: Apr. 14, 2010

(87) PCT Pub. No.: WO2009/066598
PCT Pub. Date: May 28, 2009

(65) Prior Publication Data
US 2010/0222119 A1    Sep. 2, 2010

(30) Foreign Application Priority Data
Nov. 20, 2007    (JP) .................................. 2007-300483

(51) Int. Cl.
*H04B 1/08*    (2006.01)
*H04M 1/00*    (2006.01)
(Continued)

(52) U.S. Cl.
CPC ........... *H04M 1/0274* (2013.01); *G06F 1/1626* (2013.01); *G06F 1/1656* (2013.01); *G06F 1/181* (2013.01); *H04M 1/04* (2013.01); *H05K 5/0234* (2013.01)
USPC ..................... 455/575.8; 455/575.1; 455/347; 379/428.01; 379/433.11

(58) Field of Classification Search
CPC ......... H04B 1/03; G03F 1/1628; G06F 1/181; G06F 1/1622; G06F 1/1626; H05K 5/03; H04M 1/0252; H04M 1/0283; H04M 1/04
USPC ............... 455/550.1, 575.1, 575.8, 90.3, 128, 455/347; 379/433.11, 428.01, 447
See application file for complete search history.

(56) References Cited

U.S. PATENT DOCUMENTS 5,123,044 A * 6/1992 Tate ............................. 379/451
6,701,159 B1 * 3/2004 Powell ...................... 455/575.8
(Continued)

FOREIGN PATENT DOCUMENTS

CN    2519459 Y    10/2002
JP    H03010890 U    9/1992
(Continued)

OTHER PUBLICATIONS

Chinese Office Action for CN200880117103.9 mailed on Dec. 23, 2011.
(Continued)

*Primary Examiner* — Andrew Wendell
(74) *Attorney, Agent, or Firm* — Sughrue Mion, PLLC

(57) ABSTRACT

An object of the present invention is to make an inclination angle of a mobile type electronic device held surely without increasing components of the mobile type electronic device. A connector 201 is exposed on a surface of a chassis 102 of a cellular phone 101, and a cover member 103 covers the connector 201 to protect it. A plurality of cover members 103 are made of a non-slip member respectively, and are arranged at a corner 105 where at least two surfaces of the chassis 102 intersect. When the cellular phone 101 leans against a floor and a wall 202 in a state that the cellular phone 101 leans at a predetermined angle, the cellular phone 101 is held at the inclination angle through making the cover members 103 touch the floor and the wall 202 respectively. A television image or the like displayed on a display 104 is watched from a direction of an arrow A side.

5 Claims, 5 Drawing Sheets

(51) Int. Cl.
*H04M 9/00* (2006.01)
*H04M 1/02* (2006.01)
*G06F 1/16* (2006.01)
*G06F 1/18* (2006.01)
*H04M 1/04* (2006.01)
*H05K 5/02* (2006.01)

(56) References Cited

U.S. PATENT DOCUMENTS

| | | | |
|---|---|---|---|
| 7,058,435 B2* | 6/2006 | Yamazaki | 455/575.8 |
| 7,495,895 B2* | 2/2009 | Carnevali | 361/679.26 |
| 8,119,213 B2* | 2/2012 | Antonini | 428/40.1 |
| 2005/0043060 A1* | 2/2005 | Brandenberg et al. | 455/558 |
| 2007/0238493 A1* | 10/2007 | Richardson et al. | 455/575.4 |
| 2008/0174478 A1* | 7/2008 | Whiteside et al. | 342/357.1 |
| 2012/0202565 A1* | 8/2012 | Lapstun et al. | 455/556.1 |

FOREIGN PATENT DOCUMENTS

| | | |
|---|---|---|
| JP | 6-161601 A | 6/1994 |
| JP | 8-147071 A | 6/1996 |
| JP | 2002-199076 A | 7/2002 |
| JP | 2002-295445 A | 10/2002 |
| JP | 2003-31959 A | 1/2003 |
| JP | 2003158563 A | 5/2003 |
| JP | 2006-157795 A | 6/2006 |
| JP | 2006-262052 A | 9/2006 |

OTHER PUBLICATIONS

Japanese Office Action for JP2009-542528 mailed on Oct. 26, 2012.
International Search Report of PCT Application No. PCT/JP2008/070620 mailed Jan. 6, 2009.

* cited by examiner

CONNECTOR COVER AND MOBILE TYPE ELECTRONIC DEVICE

TECHNICAL FIELD

The present invention relates to a connector cover for a mobile type electronic device to protect a connector of the mobile type electronic device by covering the connector, and the mobile type electronic device which uses the connector cover.

BACKGROUND ART

Various kinds of electronic devices including a mobile type communication device such as a cellular phone have been developed. In recent years, a case to watch a television image and a moving picture by the mobile type electronic device has increased. In this case, a dedicated cradle or a dedicated tilt leg, which is used only for making an easily-viewing angle, is necessary. FIG. 1 and FIG. 2 are side views of examples of structure to hold an angle for watching television respectively when watching television with a related cellular phone 101. A display unit 104 is arranged on a chassis 102 of the cellular phone 101, and an image which is displayed on the display unit 104 is viewed from a direction of an arrow A side.

FIG. 1 shows an example for a case of using a dedicated cradle 901. In this case, since it is necessary to carry the cradle 901 together with the cellular phone 101, it is troublesome to carry the cradle 901 and consequently, there is a problem that a defect in portability is caused.

FIG. 2 is a side view of the mobile type electronic device 101 which has a tilt leg 1001 for holding and fixing the mobile type electronic device 101 such as a cellular phone or the like at a predetermined angle. It is difficult that the tilt leg 1001 continues to have an enough strength. There is not only a possibility to cause damage to design of the cellular phone 101 since it is necessary to secure a storage space which is for storing the tilt leg 1001 at a time when the tilt leg 1001 is not used, but also a problem that internal mounting of the mobile type electronic device 1001 is restricted.

While the mobile type electronic device such as the cellular phone or the like has a connector and a connector cover which covers the connector to protect the connector, the connector cover is merely used to cover the connector and to protect the mobile type electronic device (for example, refer to patent documents 1 to 5).

Patent document 1: Japanese Patent Application Laid-Open No. 2002-199076
Patent document 2: Japanese Patent Application Laid-Open No. 2002-295445
Patent document 3: Japanese Patent Application Laid-Open No. 2003-31959
Patent document 4: Japanese Patent Application Laid-Open No. 2006-157795
Patent document 5: Japanese Patent Application Laid-Open No. 2006-262052

DESCRIPTION OF INVENTION

Problem to be Solved by Invention

The present invention is made through taking the above mentioned problem into consideration and an object of the present invention is to make it possible that a mobile type electronic device can hold an inclination angle thereof surely without increasing components of the mobile type electronic device.

Solution to Problem

The present invention provides a connector cover which is used for a mobile type electronic device and is characterized by comprising a non-slip member and being arranged at a corner at which at least two surfaces of the chassis intersect, as a connector cover which is used for the mobile type electronic device and is equipped with a cover member to cover and protect a connector exposed on any one of plural surfaces of a chassis of the mobile type electronic device.

Here, it may be preferable that each of cover members is arranged at the different corner each other.

Moreover, it may be preferable that each of the cover members has a predetermined thickness so as to project from the surface of the chassis to the outside.

Moreover, it may be preferable that an outer side of each of the cover members, which is opposite to the corner of the chassis of the mobile type electronic device, is formed flatly.

Moreover, it may be preferable that each of the cover members can be drawn from the chassis of the mobile type electronic device by a predetermined height.

Moreover, it may be preferable that each of the cover members is made of rubber or elastomer.

The present invention provides a mobile type electronic device whose chassis has a plurality of surfaces and which has the connector cover to cover the connector exposed on any one of the plural surfaces of the chassis, and specifically, provides the mobile type electronic device which uses one connector cover out of the above-mentioned connector covers for the mobile type electronic device.

Here, it may be preferable that a display unit is arranged on a surface which the connector cover can not touch and on an outer side surface of the chassis.

Effects of Invention

According to the connector cover for the mobile type electronic device of the present invention, it is possible to hold the inclination angle of the mobile type electronic device surely without increasing components of the mobile type electronic device.

According to the mobile type electronic device of the present invention, it is possible to hold the inclination angle surely without increasing components of the mobile type electronic device.

BEST MODE FOR CARRYING OUT INVENTION

Hereinafter, a connector cover for a mobile type electronic device, and the mobile type electronic device will be described in detail in the exemplary embodiment of the present invention. Further, an unit with the same function in each figure has a common sign each other.

FIG. 3 is a perspective view showing the connector cover for the mobile type electronic devices in a first exemplary embodiment of the present invention and showing an example of the connector cover for the cellular phone which has a slide structure.

FIG. 4 and FIG. 5 show an usage mode of the mobile type electronic device equipped with the connector cover for the mobile type electronic device in the first exemplary embodiment of the present invention.

In FIG. 3, signs 101, 102, 103, 104, and 105 denote a cellular phone, a chassis of the cellular phone 101, a cover member which is a component of the connector cover, a display unit, and a corner at which a plurality of surfaces of the chassis intersect respectively (sign 105 is attached to two corners at which two surfaces intersect in FIG. 3.).

As shown in FIG. 4 and FIG. 5, a connector 201 is arranged so as to be exposed on the chassis 102 and in the case that the connector 201 is not used, the connector 201 is in a state to be covered by the cover member 103 thereof.

The connector cover has a structure that the cover member 103 can rotate over the chassis 102 with a rotation axis of a support member (not shown in the figure). Consequently, it is possible that the cover member 103 moves between a position to cover the connector 201 and a position to expose the connector 201.

The cover member 103 is made of a non-slip member which has a predetermined friction coefficient. As a raw material for the cover member 103, for example, rubber or elastomer is suitable.

The display 104 displays the television image and the moving picture.

In the case that the cellular phone 101 leans against a corner of a wall 202 or the like for watching television, the cellular phone 101 leans so that the display 104 may face to a user and the cover member 103 may touch the floor and the wall 202, as shown in FIG. 4.

The cellular phone 101 enters into a stationary state in which the cellular phone 101 holds an inclination angle requested by a user, since the cover member 103, which has difficulty in slipping on the floor and the wall 202 owing to characteristics of rubber or the like, touches the floor and the wall 202. Then, the user can enjoy viewing an image displayed by the display unit 104 from a direction of an arrow A side.

On the other hand, in the case that the cellular phone 101 does not use the corner, any surrounding object is used as a support object 301 (any object can be used as the support object, if the object has a predetermined size). In this case, the support object 301 is arranged on the floor 202, and the cellular phone 101 is set so that one cover member 101 touches the floor 202 and an edge of the other cover member 103 touches the support object 301, as shown in FIG. 5.

Since each of cover members 103 has a predetermined thickness so that the cover member 103 projects to the outside from the surface of the chassis 102, the cover member 103 can be arranged so that the edge of the cover member 103 can touch the support object 301 surely.

Moreover, the cover member 103 can be hung on the support object 301. In this case, the cellular phone 101 is held at the predetermined angle by the support object 301 and then, the cellular phone 101 enters into the stationary state. So, a user can enjoy viewing the image, which is displayed by the display unit 104, from the direction of arrow A side.

As described above, according to the connector cover for the mobile type electronic device, and the mobile type electronic device of the exemplary embodiment of the present invention, since the cover member 103 is made of the non-slip member and is arranged at the corner 105, at which two surfaces of the chassis 102 intersect, so as to cover the connector 201 over a plurality of surfaces, it is possible to hold surely the inclination angle, at which a user can watch the television image and the moving picture comfortably, without the dedicated cradle or the dedicated tilt leg.

Here, through making the cover member 103 project by the predetermined height from the designed surface of the chassis 102 to make a shape of the cover member 103 convex, it is possible to make the cover member 103 touch the support object 301 more surely and consequently, more effect is obtained.

Moreover, since the cover which is used for the connector or the like and which is made of rubber or the like, is arranged at the corner 105, the cover has a function to prevent slipping and consequently, it is possible to hold surely the inclination angle which is required at a time when the cellular phone 101 leans against the surrounding object and the image displayed by the display unit 104 is watched etc. In the case of the cellular phone 101 or the like, since it is general that the cellular phone 101 or the like is equipped with the connector cover for the connector 201, it is possible to hold the inclination angle without increasing number of the components.

FIG. 6 is a perspective view showing a connector cover for a mobile type electronic device in a second exemplary embodiment of the present invention and shows an example of the connector cover for the cellular phone which has the slide structure.

FIG. 7 shows an usage mode of the mobile type electronic device equipped with the connector cover for the mobile type electronic device in the second exemplary embodiment of the present invention.

While the case of watching the image on the landscape-oriented screen is exemplified in the first exemplary embodiment, a case of watching the image on a portrait-oriented screen is exemplified in the second exemplary embodiment.

The second exemplary embodiment of the present invention also has similar effect that it is possible to hold surely the inclination angle, at which a user can watch the television image and the moving picture comfortably, without the dedicated cradle or the dedicated tilt leg as the effect of the first exemplary embodiment of the present invention.

FIG. 8 shows a connector cover for the mobile type electronic device in a third exemplary embodiment of the present invention and is a side view showing a usage mode of the mobile type electronic device (cellular phone 101 which has the slide structure is exemplified also in the third exemplary embodiment of the present invention.) equipped with the connector cover.

While the thickness of the cover member 103 is made approximately uniform in the first and the second exemplary embodiments of the present invention, each of cover members 601 has an outer side 602 which is opposite to the corner 105 of the chassis 102 of the mobile type electronic device and which is formed flatly in the third exemplary embodiment of the present invention. As a result, since a contact area of each of the cover members 601 with the floor and the wall 202 becomes large and a friction of the cover member 601 against the floor and the wall 202 becomes large and then, the cellular phone 101 can be held more surely at the desired angle.

FIG. 9 and FIG. 10 show a connector cover for the mobile type electronic device respectively in a fourth exemplary embodiment of the present invention and are side views showing a mobile type electronic device (cellular phone 101 which has the slide structure is exemplified also in the fourth exemplary embodiment) equipped with the connector cover respectively.

While the amount of the projection length of each of plural cover members 103 from the chassis 102 is fixed in the first to the third exemplary embodiments, an amount of projection length of a cover member 701 can be changed in the fourth exemplary embodiment.

The connector cover includes the cover member 701 and a pin 702 which is formed to be unified with the cover member 701. The pin 702 can move in a direction, which is indicated by an arrow B along a ditch (not shown in the figure) formed inside the chassis 102, so the cover member 701 slides in the direction which is indicated by the arrow B along the ditch. The cover member 701 is held stably both at a first position shown in FIG. 9 and at a second position shown in FIG. 10 by virtue of a detente structure which is not shown in the figures.

In the case of the first position, that is, in the case that the cover member 701 is stored in the chassis 102, the cover member 701 is in a state that the cover member 701 projects by the predetermined height from the surface of the chassis 102 as shown in FIG. 9, similarly to the first to the third exemplary embodiments. When the cover member 701 is used in the state, the fourth exemplary embodiment has similar effect of the first and the second embodiments.

Next, in the case that the cover member 701 is drawn out from the chassis 102 in a direction of projection in a state of FIG. 9, the cover member 701 slides by a working of the pin 702 to be held at the second position which projects furthermore as shown in FIG. 10. Thus, through making an amount of projection from the chassis 102 large, it is possible to hold the cellular phone 101 more stably than the case of the usage mode shown in FIG. 5.

While the case that the cellular phone is applied to the mobile type electronic device is described in each of the exemplary embodiments, it is possible that various kinds of mobile electronic devices such as PHS (Personal Handyphone System), a mobile information terminal and a mobile type personal computer are applied.

Moreover, while a plurality of cover members 103, 601 and 701 are arranged at the corner 105 at which two surfaces of the chassis 102 intersect, in each of the exemplary embodiments, it may be preferable that the cover member is arranged at a corner at which three or four surfaces intersect. In other word, it may be preferable that cover members 103, 601 and 701 can be arranged at a corner at which at least two surfaces of the chassis 102 intersect.

Moreover, it may be preferable that the cover members 103, 601 and 701 are arranged on the chassis 102 in full width, full length or full circumference thereof and that the cover member is made of elastomer.

INDUSTRIAL APPLICABILITY

The prevent invention is applicable to a connector cover for various kinds of mobile type electronic devices, each of which has a connector, such as PHS, a mobile information terminal and a mobile type personal computer. Moreover, the present invention is applicable to various kinds of mobile type electronic devices such as PHS, the mobile terminal and the mobile type personal computer.

This application is the National Phase of PCT/JP2008/070620, filed Nov. 12, 2008, which is based upon and claims the benefit of priority from Japanese Patent Application No. 2007-300483, filed on Nov. 20, 2007, the disclosure of which is incorporated herein in its entirety by reference.

REFERENCE SIGNS LIST

Figure 1:
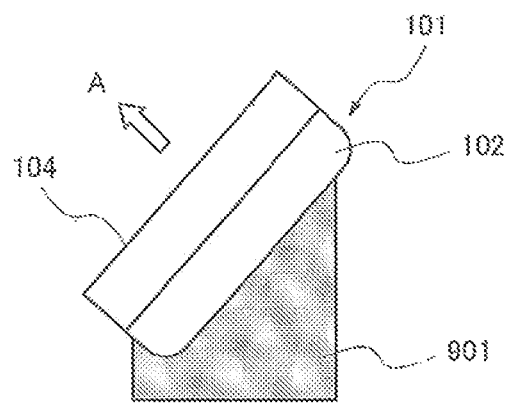
FIG. 1 shows an usage mode of a related cellular phone.
Figure 2:
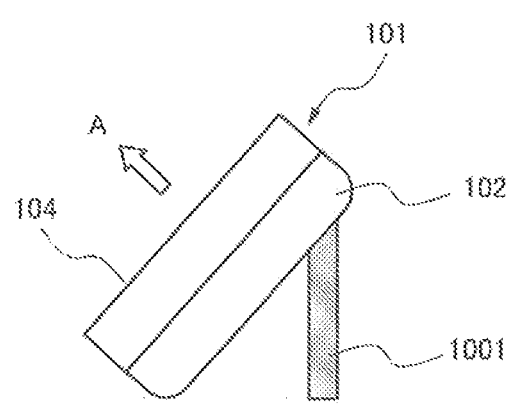
FIG. 2 shows an usage mode of the related cellular phone.
Figure 3:
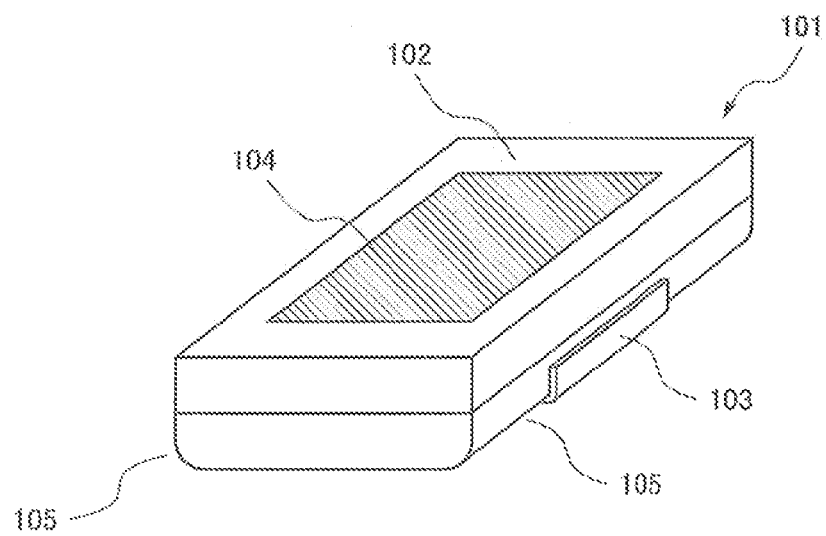
FIG. 3 is a perspective view showing a connector cover for a mobile type electronic device in a first exemplary embodiment of the present invention.
Figure 4:
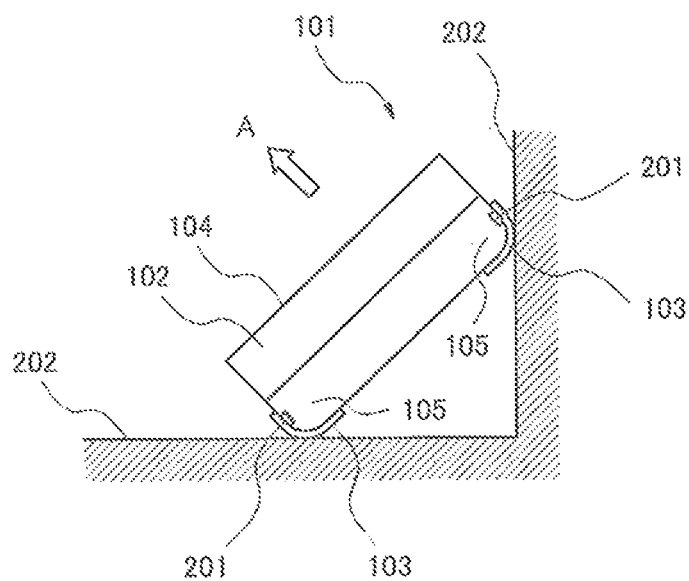
FIG. 4 is a side view showing an usage mode of the mobile type electronic device equipped with the connector cover for the mobile type electronic device in the first exemplary embodiment of the present invention.
Figure 5:
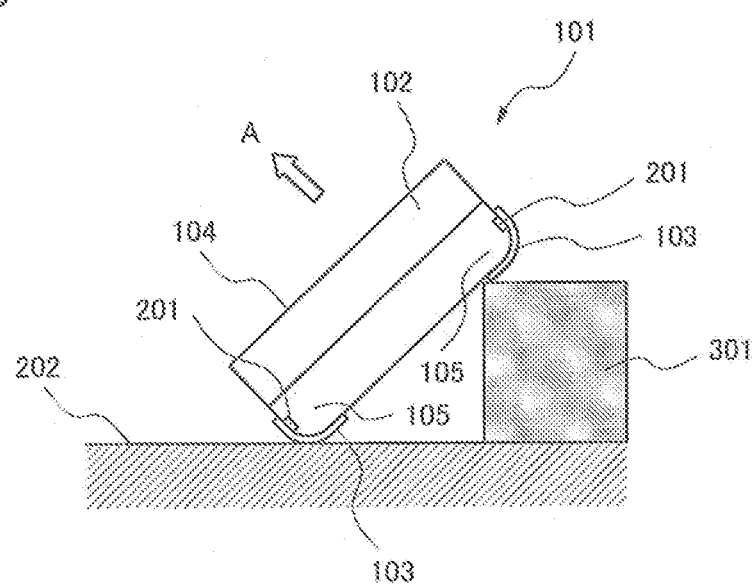
FIG. 5 is a side view showing an usage mode of the mobile type electronic device equipped with the connector cover for the mobile type electronic device in the first exemplary embodiment of the present invention.
Figure 6:
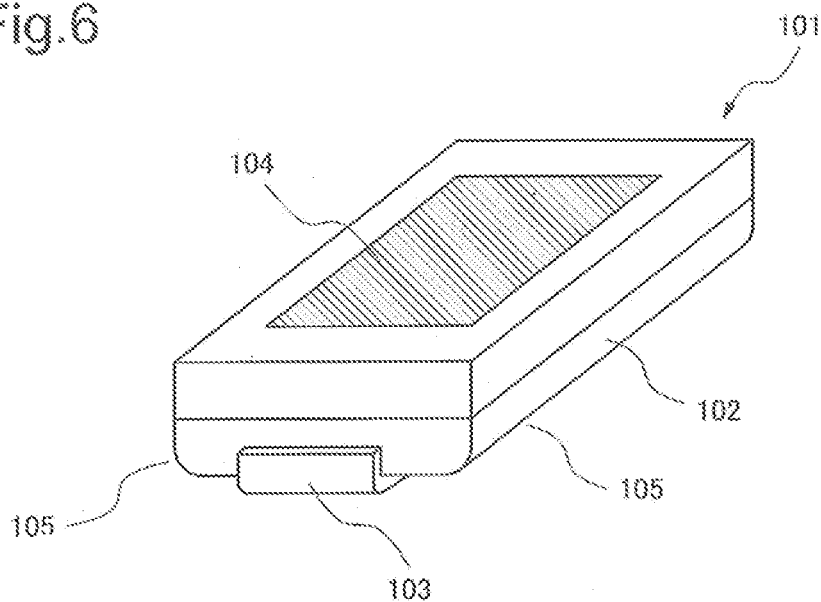
FIG. 6 is a perspective view showing a connector cover for the mobile type electronic device in a second exemplary embodiment of the present invention.
Figure 7:
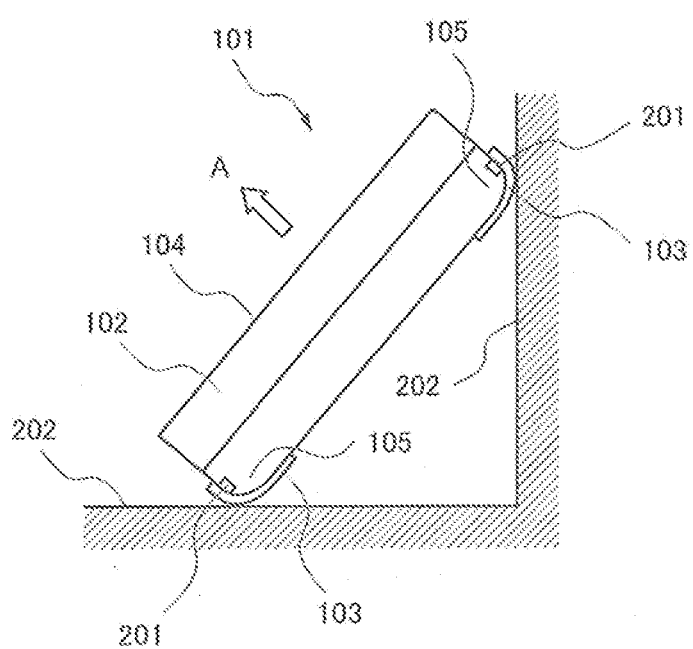
FIG. 7 is a side view showing an usage mode of the mobile type electronic device equipped with the connector cover for the mobile type electronic device in the second exemplary embodiment of the present invention.
Figure 8:
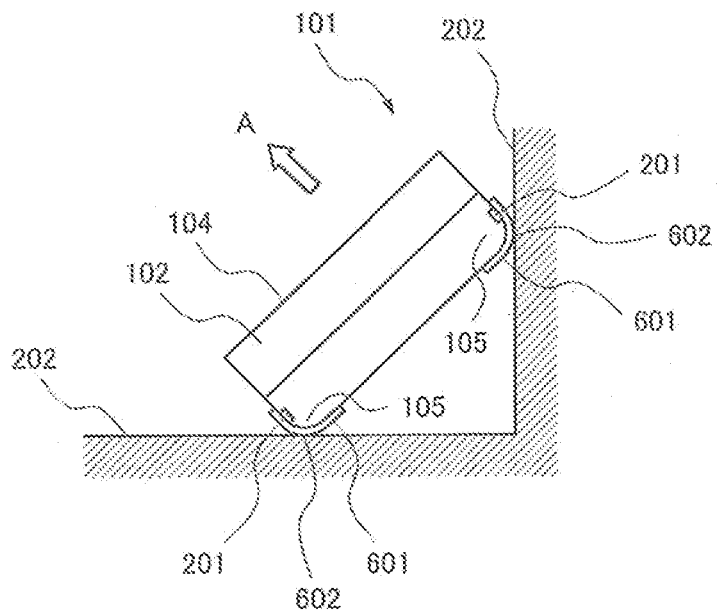
FIG. 8 shows a connector cover for the mobile type electronic device in a third exemplary embodiment of the present invention.
Figure 9:
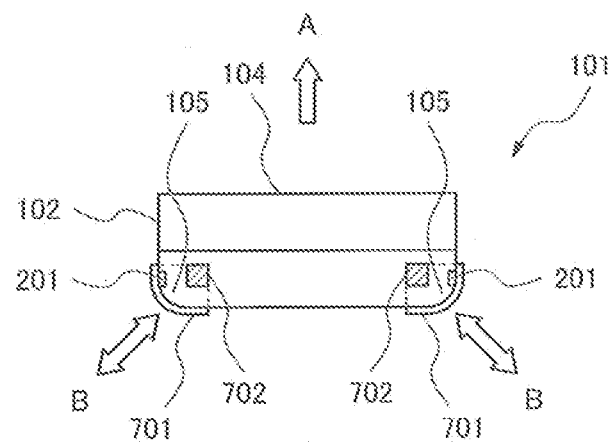
FIG. 9 shows a connector cover for the mobile type electronic device in a fourth exemplary embodiment of the present invention.
Figure 10:
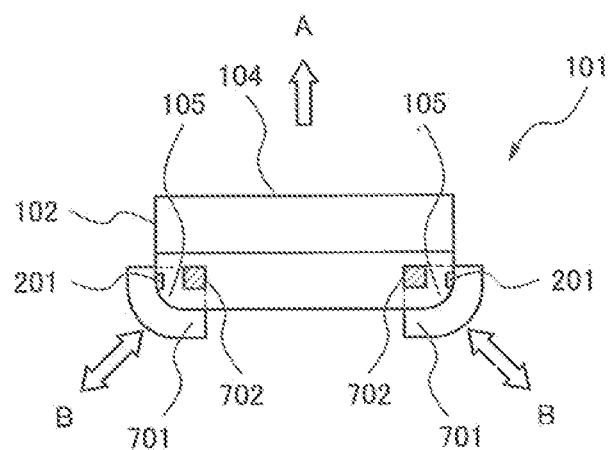
FIG. 10 shows a connector cover for the mobile type electronic device in the fourth exemplary embodiment of the present invention.

101 Cellular phone
102 Chassis
103, 601 and 701 Cover member
104 Display unit
105 Corner
201 Connector
202 Floor or wall
602 Outer side
702 Pin
901 Cradle
1001 Tilt leg

The invention claimed is:
1. A mobile type electronic device comprising:
two connectors exposed on any one of plural surfaces of a chassis of said mobile type electronic device; and
two connector covers for covering said connectors respectively,
wherein said connector covers are made of a non-slip member,
wherein said connector covers are arranged at corners of said chassis at which at least two surfaces of said chassis intersect,
wherein said connector covers are movable to a position above said respective connectors and to a position for exposing said respective connectors, and
wherein one of said two connector covers touches a horizontal plane and the other connector cover touches a vertical plane, when said mobile type electronic device leans against a corner formed by said horizontal plane and said vertical plane, and wherein said mobile type electronic device further comprises:
a display unit which is arranged on a front surface of said chassis and comprises a screen,
wherein said two connectors are exposed near a back surface, which is opposite to the front surface, on opposite side surfaces, respectively,
wherein said two connector covers are extended to the back surface so as to be arranged at said corners of said chassis at which said at least two surfaces of said chassis intersect, and
wherein said two connector covers each comprise edges which are parallel to two sides of said screen, and said two connector covers are movable so that said edges conform to said corner to thereby orient said screen such that said two sides of said screen are parallel to said horizontal plane and said vertical plane, and said screen is oriented to a viewing angle set by a user.

2. The mobile type electronic device according to claim 1, wherein said connector covers do not touch said front surface.

3. The mobile type electronic device according to claim 1, wherein each of said connector covers has a predetermined thickness so as to project to the outside from one of said surfaces of said chassis.

4. The mobile type electronic device according to claim 1, wherein each of said connector covers can be drawn out from said chassis of said mobile type electronic device by a predetermined height.

5. The mobile type electronic device according to claim 1, wherein each of said connector covers is made of rubber or elastomer.

* * * * *